(12) United States Patent
Sakakibara et al.

(10) Patent No.: US 7,098,081 B2
(45) Date of Patent: Aug. 29, 2006

(54) SEMICONDUCTOR DEVICE AND METHOD OF MANUFACTURING THE DEVICE (75) Inventors: Masayuki Sakakibara, Hamamatsu (JP); Masaru Morishita, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/490,980

(22) PCT Filed: Sep. 27, 2002

(86) PCT No.: PCT/JP02/10090

§ 371 (c)(1),
(2), (4) Date: Mar. 26, 2004

(87) PCT Pub. No.: WO03/030259

PCT Pub. Date: Apr. 10, 2003

(65) Prior Publication Data

US 2005/0003582 A1 Jan. 6, 2005

(30) Foreign Application Priority Data

Sep. 27, 2001 (JP) .............................. 2001-297620

(51) Int. Cl.
*H01L 21/44* (2006.01)
*H01L 23/48* (2006.01)

(52) U.S. Cl. ........................ 438/123; 438/112; 438/111; 257/692; 257/666

(58) Field of Classification Search ................ 438/111, 438/125, 113, 127, 65, 667, 112, 123; 257/679, 257/698, 692, 730, 788, 787, 666

See application file for complete search history.

(56) References Cited

U.S. PATENT DOCUMENTS

| 4,920,074 | A |   | 4/1990  | Shimizu et al. ............. 437/211 |
| 5,270,492 | A | * | 12/1993 | Fukui .......................... 174/52.4 |
| 5,729,437 | A | * | 3/1998  | Hashimoto ................... 361/760 |
| 5,767,580 | A | * | 6/1998  | Rostoker ...................... 257/737 |
| 6,301,119 | B1| * | 10/2001 | Thevenot et al. ............ 361/737 |
| 6,313,524 | B1| * | 11/2001 | Pueschner et al. ........... 257/698 |
| 6,383,835 | B1| * | 5/2002  | Hata et al. ..................... 438/65 |
| 6,420,790 | B1| * | 7/2002  | Koizumi ....................... 257/787 |
| 6,548,888 | B1| * | 4/2003  | Fidalgo et al. ............... 257/679 |
| 6,601,295 | B1| * | 8/2003  | Maekawa ...................... 29/841 |
| 2002/0125546 | A1 | * | 9/2002 | Muta .......................... 257/531 |

FOREIGN PATENT DOCUMENTS

| EP | 0 977 251 A1 | 2/2000 |
| JP | 62 11 2333   | 5/1987 |
| JP | 02-302068    | 12/1990 |
| JP | 3-108745     | 5/1991 |
| JP | 4-72649      | 6/1992 |
| JP | 7-111307     | 4/1995 |
| JP | 8-64743      | 3/1996 |
| JP | 10-207467    | 8/1998 |
| JP | 2001-035961  | 2/2001 |
| JP | 2001-77268   | 3/2001 |

\* cited by examiner

*Primary Examiner*—David Zarneke
*Assistant Examiner*—Igwe U. Anya
(74) *Attorney, Agent, or Firm*—Drinker Biddle & Reath LLP

(57) ABSTRACT

Cut faces 15*a* to 15*h* are formed on the front end faces 13*a* to 13*h* of the exposed portions 12*a* to 12*h* of respective lead terminals 11*a* to 11*h* of a semiconductor device 100, and plating for increasing the solderability is provided on the cut faces 15*a* to 15*h*.

5 Claims, 6 Drawing Sheets

SEMICONDUCTOR DEVICE AND METHOD OF MANUFACTURING THE DEVICE

TECHNICAL FIELD

The present invention relates to a semiconductor device mounted with a semiconductor element, and to a method of manufacturing the semiconductor device.

BACKGROUND ART

Figure 8:
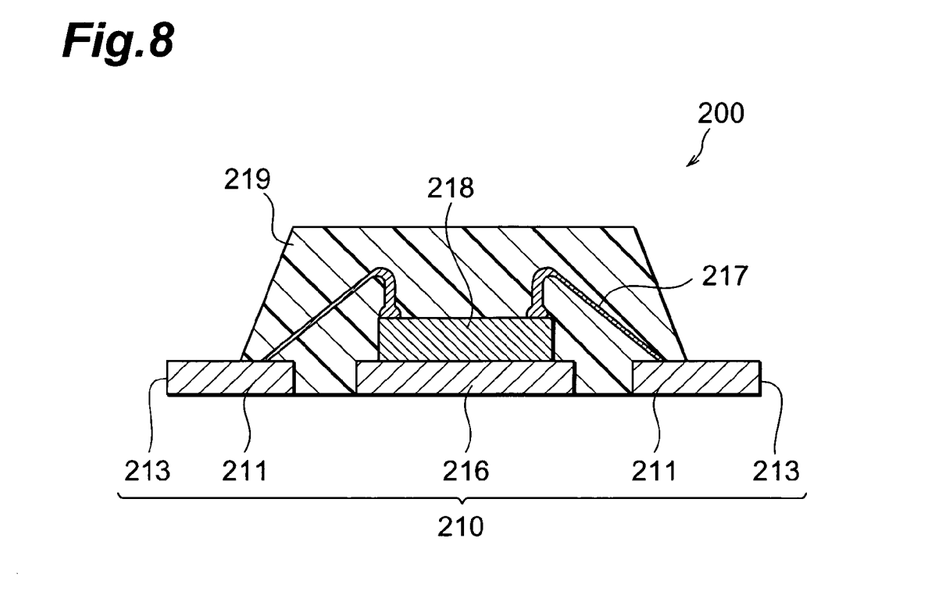
FIG. 8 is a diagram showing the composition of a conventional semiconductor device 200.

Conventionally, a semiconductor device 200 using a lead frame is proposed, as illustrated in FIG. 8. In this semiconductor device 200, the side on the lead frame 210 on which the semiconductor element is mounted and the regions between the lead terminals 211 are molded in resin 219. Each lead terminal 211 is connected to the semiconductor element 218 on the semiconductor element mounting section 216 by means of bonding wires 217. Furthermore, an exposed portion of each lead terminal 211, which is exposed from the resin 219, is plated in such a manner that solder can be jointed readily to same.

DISCLOSURE OF THE INVENTION

However, the front end face 213 of each lead terminal 211 of the lead frame 210 is a face formed by cutting the lead terminal 211, and if the lead terminal 211 is cut after plating, then plating metal will not be coated on the front end faces 213 thereof, and hence solder will not be liable to joint to same.

In view of problems of this kind, it is an object of the present invention to provide a semiconductor device in which solder can be applied readily to the front end faces of the lead terminals thereof, and to a method of manufacturing such a semiconductor device.

In order to achieve the aforementioned object, the semiconductor device according to the present invention is a semiconductor device wherein a semiconductor element is mounted on a lead frame having a plurality of lead terminals, the semiconductor element being connected electrically to each of the plurality of lead terminals, and both the mounting side of the lead frame on which the semiconductor element is mounted and the regions between the respective lead terminals being molded by means of resin, characterized in that the front end faces of the exposed portions of each of the plurality of lead terminals are plated with a metal having better solderability than the material of the lead frame.

Thereby, since the front end faces of the exposed portions of each one of a plurality of lead terminals are plated with a metal which increases the solderability, then solder can be applied readily to the front end faces of the lead terminals.

Moreover, the semiconductor device according to the present invention is also characterized in that the front end faces of the exposed portion of each of the plurality of lead terminals are constituted by cut faces and concave faces connecting to the cut faces, and the concave faces are plated. Furthermore, it is also characterized in that the plating is either gold, silver, palladium, or an alloy thereof.

Furthermore, the method for manufacturing a semiconductor device according to the present invention is a method for manufacturing a semiconductor device, characterized in comprising the steps of: mounting a semiconductor element on a lead frame, in which through holes are formed respectively at a plurality of lead terminals and metal for increasing the solderability is plated onto the inner walls of the through holes; electrically connecting the semiconductor element with each of the plurality of lead terminals; molding both the mounting side of the lead frame on which the semiconductor element is mounted, and the regions between the respective lead terminals, with resin, in such a manner that the through holes are exposed; cutting each of the plurality of lead terminals at the positions at which the through holes are formed; and taking a portion of the inner wall of each through hole to be a portion of the front end face of one of the plurality of lead terminals.

Thereby, since the front end faces of the plurality of lead terminals are plated with a metal which increases the solderability, then it is possible to obtain a semiconductor device in which solder can be applied readily to the front end faces of the lead terminals.

Furthermore, the method for manufacturing a semiconductor device according to the present invention is characterized in that the through holes are independently sealed by means of a metal mold, when the mounting side of the lead frame on which the semiconductor element is mounted and the regions between the respective lead terminals are molded with resin.

BEST MODE FOR CARRYING OUT THE INVENTION

Below, a preferred embodiment of the present invention is described in detail with respect to the accompanying drawings. In order to simplify the following description, wherever possible, the same reference numbers are applied to the same constituent elements in the respective drawings, and repeated description thereof is omitted.

Figure 1:
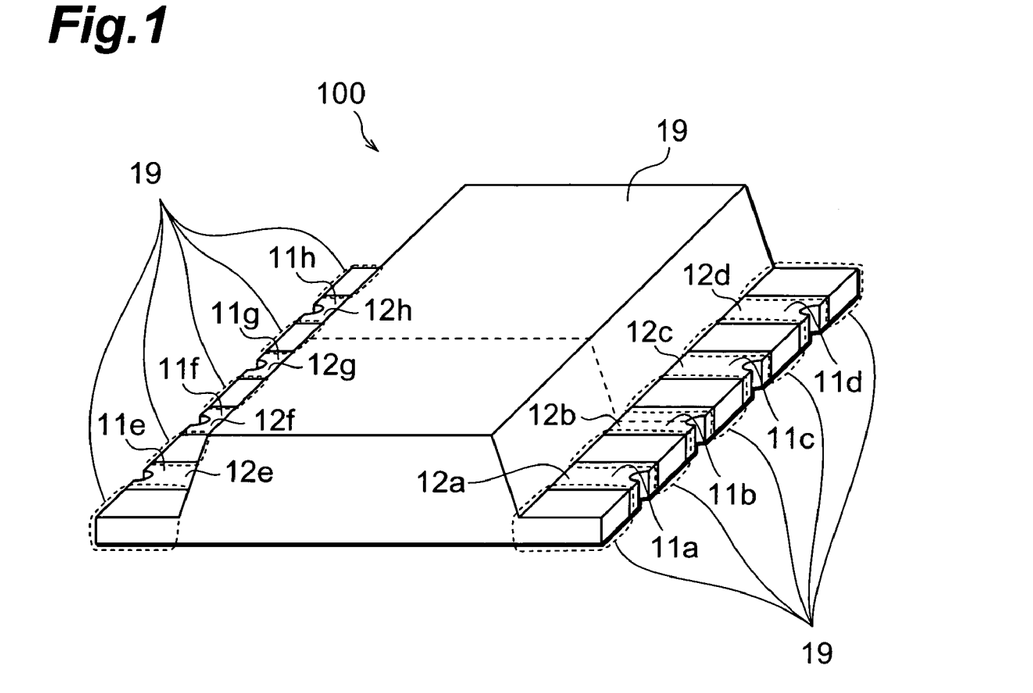
FIG. 1 is an oblique view of a semiconductor device 100 relating to the present embodiment.
Figure 2:
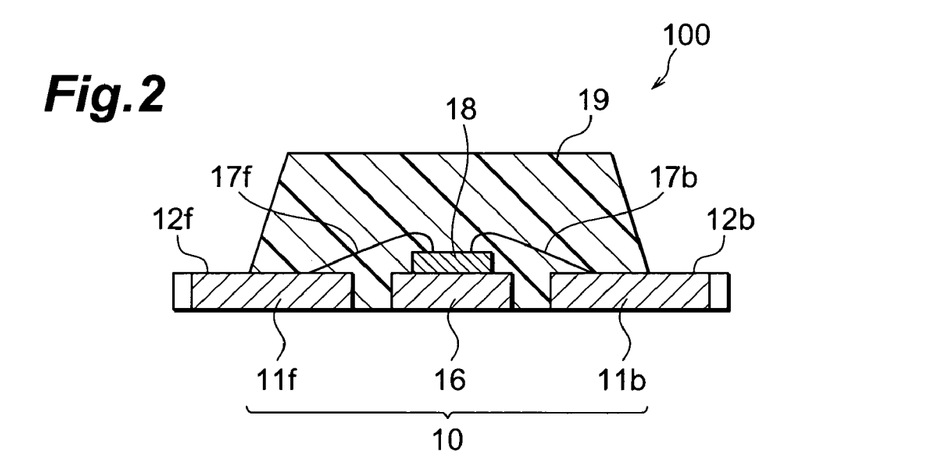
FIG. 2 is a cross-sectional view of a semiconductor device 100 relating to the present embodiment.

Firstly, an embodiment of a semiconductor device relating to the present invention will be described. FIG. 1 is an oblique view of a semiconductor device 100 relating to the present embodiment. FIG. 2 is a cross-sectional view of a semiconductor device 100 showing a section which is perpendicular to the lead frame 10 illustrated in FIG. 1 and follows a line passing through the lead terminal 11b and the lead terminal 11f (a section passing along the dotted line illustrated in FIG. 1).

Below, a semiconductor device relating to the embodiment is described with reference to FIG. 1 and FIG. 2.

The semiconductor device 100 is constituted by a lead frame 10, bonding wires 17b, 17f, and the like, a semiconductor element 18, and resin 19.

The lead frame 10 is made of metal, for example, it is made of a copper alloy or iron alloy, or the like. This lead frame 10 comprises 8 lead terminals 11a to 11h and a semiconductor element mounting section 16.

The semiconductor element 18 may be an optical semiconductor element, an IC chip, or the like, and is mounted by being adhered to the semiconductor element mounting section 16 by means of an adhesive. Bonding pads (not illustrated) are formed on the surface of the semiconductor element 18.

The semiconductor device 100 comprises a plurality of bonding wires 17b, 17f of this kind. The bonding wires 17b, 17f, and the like, are made of thin metal wire. One end of each bonding wire 17b, 17f, and the like, is connected to any one of the bonding pads on the surface of the semiconductor element 18, and the other end thereof is connected to any one of the lead terminals 11a to 11h.

The resin 19 has an insulating property, and covers and seals a portion of each of the lead terminals 11a to 11h, the semiconductor element mounting section 16, the bonding wires 17b, 17f, and the like, and the semiconductor element 18. Moreover, the resin 19 also prevents shorting between the respective bonding wires 17b, 17f, and the like.

The resin 19 is molded between the mounting side of the lead frame 10 on which the semiconductor element 18 is mounted and each of the lead terminals 11a to 11h. Moreover, the resin 19 is also molded onto the another side of the lead frame 10, to such an extent that the lead frame 10 is not exposed. However, the thickness of the resin 19 on the another side of the lead frame 10 is less than the thickness of the resin 19 on the mounting side of the lead frame 10. This is in order that, when installing the frame onto a substrate, there will be no bending of the lead terminals 11a–11h, and there will be no need to lengthen the lead terminals 11a to 11h. Moreover, the thickness of the resin 19 between the lead terminals 11a to 11h is virtually the same as that of the lead terminals 11a to 11h.

The regions surrounding the respective lead terminals 11a to 11h of the lead frame 10 are covered by resin 19 on the sides near to the semiconductor element 18, and the sides of the respective lead terminals which are distant from the semiconductor element 18 of the respective lead terminals 11a to 11h form exposed sections 12a to 12h.

Next, the exposed sections 12b of the lead terminal 11b shown in FIG. 2 are illustrated with reference to FIG. 3.

Figure 3:
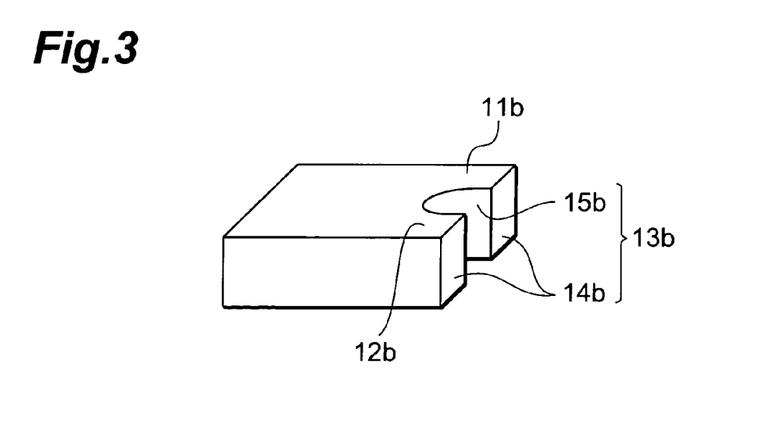
FIG. 3 is an enlarged view of the exposed portion 12b of a lead terminal 11b of the semiconductor device 100 relating to the present embodiment.

FIG. 3 is an enlarged diagram of the exposed section 12b of a lead terminal 11b of a semiconductor device 100 relating to the present embodiment. The lead terminal 11b includes an exposed section 12b, and the exposed section 12b comprises a front end face 13b on the front end thereof. Moreover, the front end face 13b is constituted by a cut face 14b and a concave face 15b connected to this cut face 14b.

The concave face 15b is formed in such a manner that it is cut from the front end of the exposed section 12b of the lead terminal 11b. The concave face 15b is so named because it is formed by concaving the front end of the exposed section 12b.

Plating is carried out on the surface of the lead frame 10 including the lead terminal 11b. Here, the plating is carried out using a metal having better solderability than the metal forming the lead frame 10, and this metal is one which enhances both the solderability and the bond strength of the bonding wires 17b, 17f, and the like, which connect between the semiconductor element 18 and the lead terminals 11a to 11h. More specifically, this metal is silver, gold, palladium, or an alloy of same, of the like, and it may be formed by laminating a plurality of metal layers.

The front end face 13b has a portion that is plated and a portion that is not plated. The portion that is plated is the concave face 15b and the portion that is not plated is the cut face 14b. Therefore, the cut face 14b has poor solderability, whereas the concave face 15b has good solderability.

The fact that the front end face 13b has a face that is plated and a face that is not plated in this way is due to the fact that, during manufacture, the respective lead terminals 11a to 11h are cut after the whole of the lead frame 10 is plated. Therefore, the cut face 14b formed by cutting is not plated.

The exposed section 12b of the lead terminal 11b was described above with reference to FIG. 3, but the composition of this exposed section 12b is the same as that of the exposed sections 12a, 12c to 12h of the other lead terminals 11a, 11c to 11h. Therefore, description of the exposed sections 12a, 12c to 12h of the lead terminals 11a, 11c to 11h is omitted here.

The lead terminals 11a to 11h of the semiconductor device 100 of this kind are connected electrically to wiring patterns on a substrate. Firstly, in order to connect the lead terminals 11a to 11h to the wiring patterns, the semiconductor device 100 is placed on the substrate. Thereupon, solder is applied to the front end faces 13a to 13h of the lead terminals 11a to 11h and to the wiring patterns on the substrate.

Figure 4:
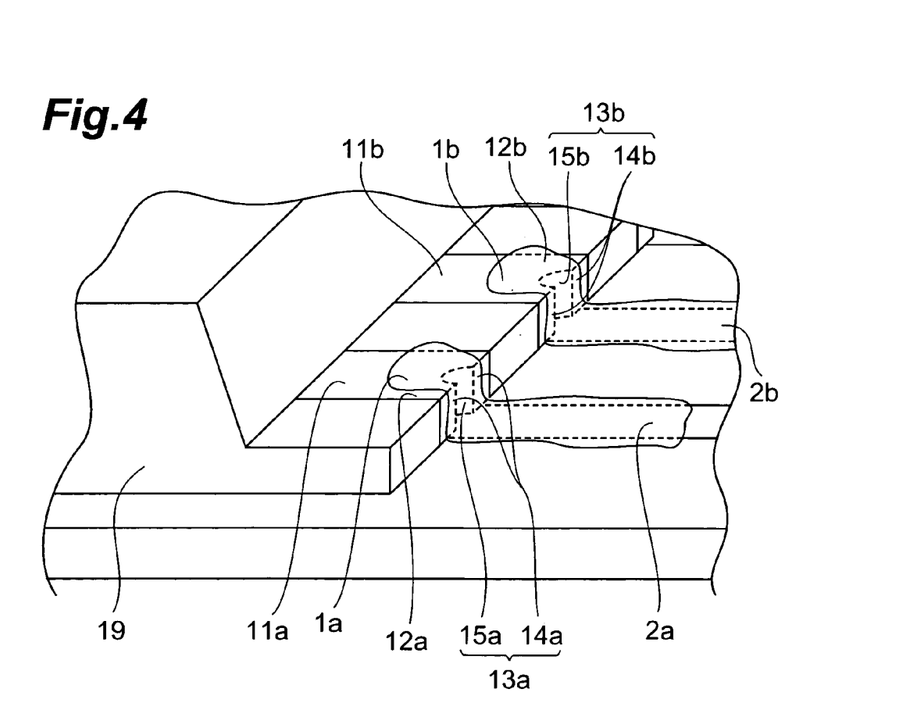
FIG. 4 is a diagram showing a state where the lead terminals 11a, 11b of the semiconductor device 100 relating to the present embodiment are connected to wiring patterns 2a, 2b.

FIG. 4 is a diagram showing a state in which the lead terminals 11a, 11b of the semiconductor device 100 relating to the present embodiment are connected to wiring patterns 2a, 2b. In FIG. 4, the image of the lead terminals 11c to 11h being connected to the wiring patterns 2c to 2h is omitted from the illustration.

As shown in FIG. 4, although solder 1a, 1b is applied to the front end faces 13a, 13b of the lead terminals 11a, 11b, and to the wiring patterns 2a, 2b on the substrate, it also travels up onto the upper face of the exposed sections 12a, 12b of the lead terminals 11a, 11b. This is because a metal plating having good solderability is formed on the concave faces 15a, 15b. In other words, the plating which has good solderability promotes the travel of the solder 1a, 1b up onto the upper face of the exposed sections 12a, 12b.

If it were supposed that there were no concave faces 15a, 15b, and no metal plating were formed on the front end faces 13a, 13b, then the solder 1a, 1b would not travel up onto the upper face of the exposed sections 12a, 12b of the lead terminals 11a, 11b.

Since concave faces 15a, 15b which are plated with metal having good solderability are provided on the front end faces 13a, 13b of the lead terminals 11a, 11b, then the solder 1a, 1b can be applied readily to the front end faces 13a, 13b of the lead terminals 11a, 11b. Moreover, the solder 1a, 1b travels up onto the upper face of the exposed sections 12a, 12b, thereby securing the connection between the lead terminals 11a, 11b and the wiring patterns 2a, 2b on the substrate. The foregoing description applies similarly to the connections between the lead terminals 11c to 11h and the wiring patterns 2c to 2h.

Above, the semiconductor device 100 comprises concave faces 15a to 15h which are plated, on the front end faces 13a to 13h of the lead terminals 11a to 11h, and therefore the solderability of the front end faces 13a to 13h of the lead terminals 11a to 11h are good, and hence solder can be applied readily to the front end faces 13a to 13h of the lead terminals 11a to 11h.

Next, the composition of the actual lead frame shall be described in detail.

Figure 5:
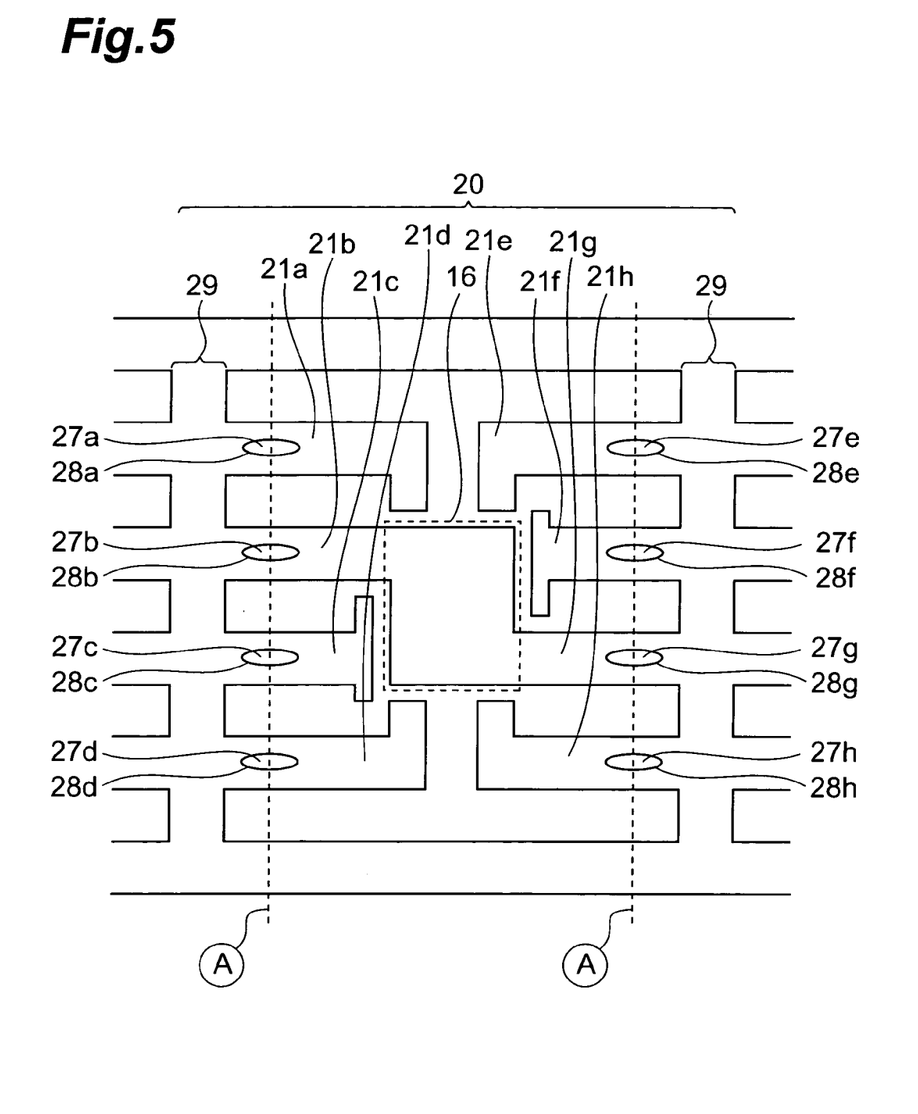
FIG. 5 is a diagram showing the composition of a lead frame 20 used in a semiconductor device 100 relating to the present embodiment.

FIG. 5 is a diagram showing the composition of a lead frame 20 used in a semiconductor device 100 relating to the present embodiment. Since the eight lead terminals 21a to 21h only differ from the eight lead terminals 11a to 11h described above in terms of their shape, further description thereof is omitted here. Moreover, description of the semiconductor element mounting section 16 is also omitted.

The lead frame 20 comprises dam bars 29, in addition to the eight lead terminals 21a to 21h and the semiconductor element mounting section 16. This lead frame 20 is metallic and is made, for example, from a copper alloy or iron alloy.

Through holes 27a to 27h are formed respectively on the eight lead terminals 21a to 21h of the lead frame 20. The through holes 27a to 27h are elliptical in shape. The respective lead terminals 21a to 21h are not cut.

Dam bars 29 are connected to the lead terminals 21a to 21h, in such a manner that resin 19 flowing in between the respective lead terminals 21a to 21h during molding is halted at the position of the dam bars 29.

The lead frame 20 of the shape described above is subjected to plating covering the whole peripheral region thereof, and suitable materials for use in plating are gold, silver, palladium, or alloys of same. Moreover, this plating is also carried out in order to make wire bonding easier to perform.

Furthermore, since plating is carried out over the whole peripheral region of the lead frame 20, the inner walls 28a to 28h of the through holes 27a to 27h also are plated.

It is assumed now that the eight lead terminals 21a to 21h are respectively cut at the positions where the through holes 27a, 27h are formed (for example, position A indicated by the dotted line in FIG. 5). In such a case, the eight lead terminals 21a to 21h are formed respectively with front end faces 13a to 13h similar to those described with reference to FIG. 3 above. In other words, a portion of the inner wall 28a to 28h of each through hole 27a to 27h (this portion being on the side adjacent to the semiconductor element 18) forms a composition similar to that of the respective concave faces 15a to 15h illustrated in FIG. 3, and the sections where the lead terminals 21a to 21h are cut respectively form a composition similar to that of the cut faces 14a to 14h illustrated in FIG. 3.

Consequently, plating is not performed on the cut faces 14a to 14h of the eight lead terminals 21a to 21h formed by cutting, whereas plating is performed on the concave faces 15a to 15h.

According to the foregoing, in the lead frame 20, since through holes 27a to 27h are formed respectively on the eight lead terminals 21a to 21h, and plating is performed on the inner walls 28a to 28h of these through holes 27a to 27h, then it is possible to obtain a semiconductor device 100 where solder can be applied readily to the front end faces of the lead terminals.

Next, an embodiment of a method of manufacturing a semiconductor device relating to the present invention will be described. A lead frame 20 as described above is used in the manufacture of this semiconductor device 100.

Figure 6:
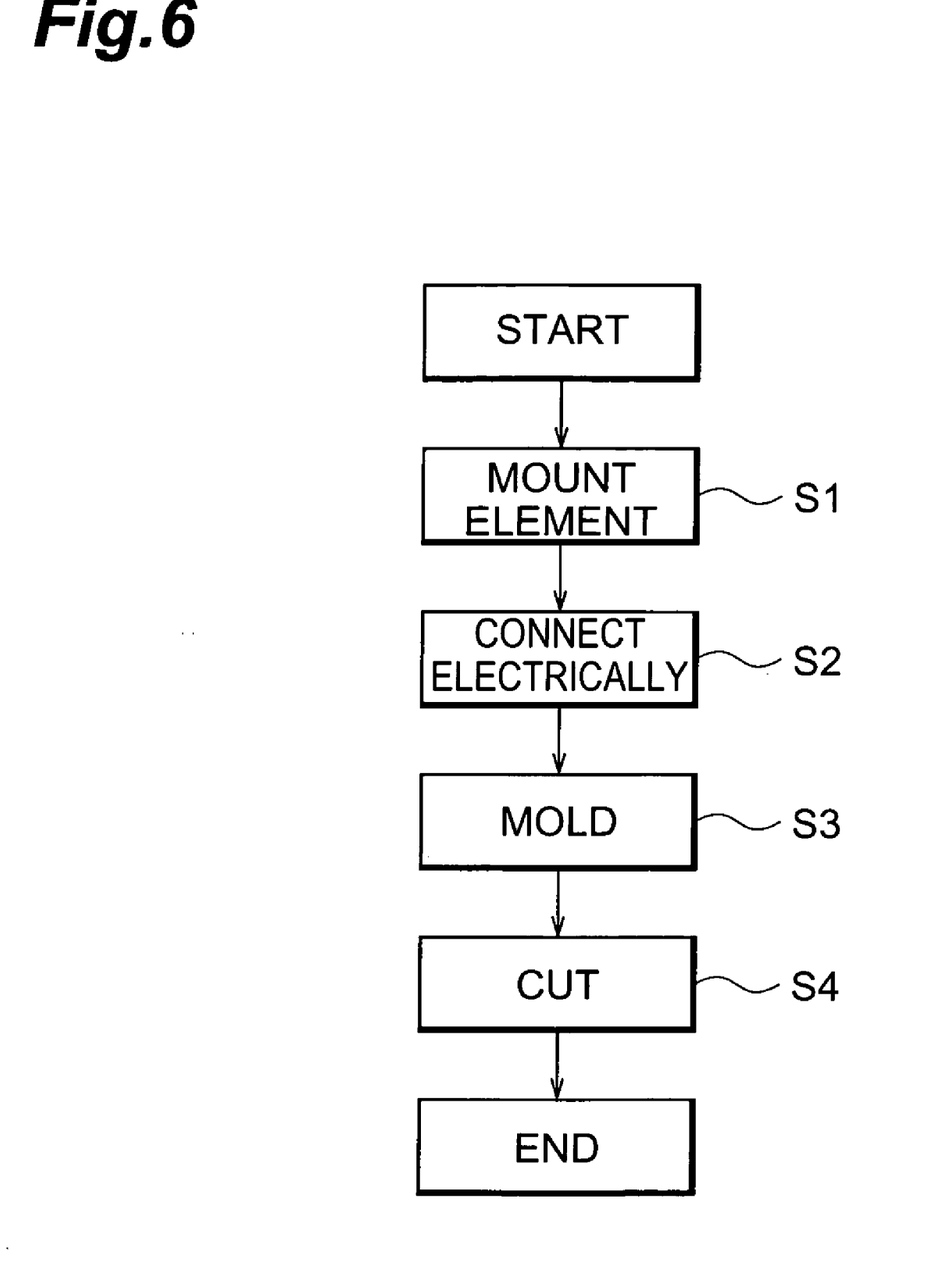
FIG. 6 is a flowchart showing a process for manufacturing a semiconductor device 100 relating to the present embodiment.

FIG. 6 is a flowchart showing a manufacturing process for a semiconductor device 100 relating to the present invention. Firstly, a semiconductor element 18 is mounted on a semiconductor element mounting section 16 of a lead frame 20 as described with reference to FIG. 5 (S1). This semiconductor element 18 is mounted by adhering it to the semiconductor element mounting section 16 by means of an adhesive.

Thereupon, wire bonding is carried out (S2). Here, the bonding pads and the lead terminals 21a to 21h of the semiconductor element 18 are connected by bonding wires 17b, 17f, and the like. In this case, the connection between the semiconductor element 18 and the lead terminals 21a to 21h is made by wire bonding, but it is not limited to this, and a simple electrical connection would be sufficient. Consequently, there may be lead terminals 21a to 21h which are not connected by bonding wires 17b, 17f, and the like, and hence the number of bonding wires 17b, 17f, and the like, is not limited to eight.

Thereupon, molding is performed (S3). A metal mold is used for molding. The action of molding is now described with reference to FIG. 7.

Figure 7:
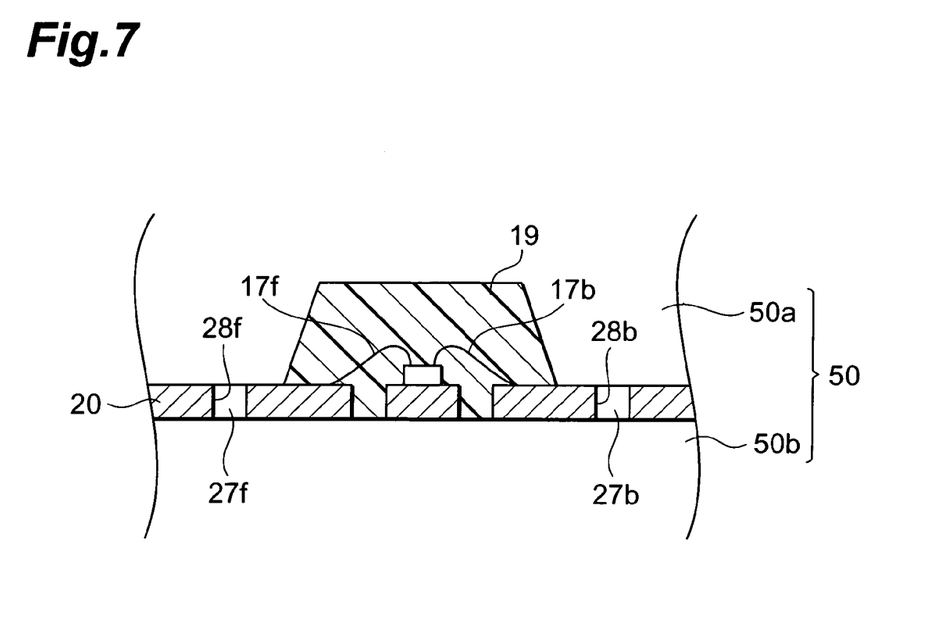
FIG. 7 is a diagram showing a state where the resin 19 of the semiconductor device 100 relating to the present embodiment is formed by a metal mold 50.

FIG. 7 shows a state where the resin 19 of a semiconductor device 100 relating to the present embodiment is molded by means of a metal mold 50. A semiconductor element 18 is mounted on the lead frame 20, and the semiconductor element 18 and the lead terminals 21a to 21h are connected electrically, whereupon this assembly is placed into a space formed between an upper mold 50a and a lower mold 50b. Thereafter, resin 19 is filled into the space created by the mold 50.

In this case, a portion of each lead terminal 21a to 21h on the lead frame 20 is sandwiched between the upper mold 50a and the lower mold 50b. Moreover, the lead terminals 21a to 21h are sandwiched between the upper mold 50a and the lower mold 50b in such a manner that the through holes 27a to 27h are independently sealed. A portion of each of the lead terminals 21a to 21h thus held in a sandwiched state is not sealed by the resin 19. This is because the resin 19 does not flow out into the portion of the lead terminals 21a to 21h that is sandwiched between the upper mold 50a and the lower mold 50b. Consequently, the act of sandwiching the lead frames 20 creates exposed sections 12a to 12h of the lead terminals 21a–21h, and prevents the resin 19 from filling into the through holes 27a to 27h formed in the lead terminals 21a to 21h.

Moreover, the resin 19 flows in between the lead terminals 21a to 21h. This is because the metal mold 50 cannot sandwich and close the space between the respective lead terminals 21a to 21h. Furthermore, the resin 19 that flows in between the lead terminals 21 is halted at the position of the dam bars 29, in such a manner that it does not flow any further beyond same.

Moreover, the resin 19 also flows onto the another side of the semiconductor element 18 of the lead frame 20. However, it does not flow onto the portion of the lead terminal 21 sandwiched by the metal mold 50. The amount of resin 19 that flows onto the another side is less than the amount of resin 19 that flows onto the mounting side.

When the resin 19 has hardened, a sealed body in which the various constituent elements that are molded are sealed by the resin 19, is removed from the forming molds 50. The sealed body is sealed in such a manner that the respective bonding wires 17b, 17f, and the like, do not make mutual contact, and furthermore, the bonding wires 17b, 17f, and the like, do not project out from the resin 19.

Thereupon, the respective lead terminals 21a to 21h are cut (S4). The lead terminals 21a to 21h are cut at the position A indicated by the dotted line in FIG. 5. In other words, the lead terminals 21 are cut at the respective positions where the through holes 27a to 27h are formed. Since the resin 19 flows out between the lead terminals 21a to 21h, the resin 19 that has flown out in this way is cut together with the respective lead terminals 21a to 21h. In cutting, a dicing device or pressure cutting device having a fine, rotatable diamond blade is used, in such a manner that no load is applied to the bonded portion (contacting portion) between the lead terminals 21a to 21h and the resin 19. By means of such a device, the lead terminals 21a to 21h are cut, together with the resin 19 between the lead terminals 21a to 21h, thereby forming a semiconductor device 100.

The position A indicated by the dotted line in FIG. 5 is the position at which the through holes 27a to 27h are formed. Therefore, a portion of the inner wall 28a to 28h of each of the through holes 27a to 27h remains in the front end face 13a to 13h of the lead terminal 21a to 21h of the semiconductor device 100 thus formed by cutting. A portion of the inner wall 28a to 28h of each of the through holes 27a to 27h forms a concave face 15a to 15h. These concave faces 15a to 15h are plated.

By means of the foregoing, it is possible to obtain a semiconductor device 100 comprising concave faces 15a to 15h which are portions of the inner walls 28a to 28h of the through holes 27a to 27h, on the front end faces of the lead terminals 21a to 21h. Since these concave faces 15a to 15h are plated, the front end faces 13a to 13h of the lead terminals 21a to 21h have good solderability. Therefore, a semiconductor device 100 can be obtained in which solder can be applied readily to the front end faces 13a to 13h of the lead terminals 21a to 21h.

In the present embodiment described above, the through holes 27a to 27h were taken to be elliptical, but their shape is not limited to this and may be changed to another shape, such as a circular shape, oval shape, diamond shape, square shape, or the like.

In the semiconductor device of the present invention, since plating, which improves the solderability, is carried out at the front end faces of the lead terminals, it is easy to apply solder to the front end faces of the lead terminals.

In the semiconductor device according to the present invention, since plating is carried out which improves the solderability at the front end faces formed by cutting a plurality of lead terminals, then it is possible to obtain a semiconductor device in which solder can be applied readily to the front end faces of the lead terminals.

INDUSCTRIAL APPILCABILITY

The present invention can be applied to a semiconductor device on which a semiconductor element is mounted, and a method of manufacturing a semiconductor device.

What is claimed is:

1. A method for manufacturing a semiconductor device, comprising the steps of:
   mounting a semiconductor element on a lead frame, in which through holes are formed respectively at a plurality of lead terminals and metal for increasing the solderability is plated onto the inner walls of said through holes;
   electrically connecting said semiconductor element with each of said plurality of lead terminals;
   molding both the mounting side of said lead frame on which said semiconductor element is mounted, and the regions between the respective lead terminals, with resin, in such a manner that said through holes are exposed;
   cutting each of said plurality of lead terminals at the positions at which said through holes are formed; and
   taking a portion of the inner wall of each through hole to be a portion of the front end face of one of said plurality of lead terminals.

2. The method for manufacturing a semiconductor device according to claim 1,
   wherein said through holes are independently sealed by means of a metal mold, when the mounting side of said lead frame on which said semiconductor element is mounted and the regions between the respective lead terminals are molded with resin.

3. A semiconductor device comprising:
   a lead frame having a plurality of lead terminals;
   a semiconductor element mounted on a first surface of said lead frame, being connected electrically to each of said plurality of lead terminals, said first surface being at the mounting side; and
   molding resin covering said first surface and a part of a second surface, the second surface being comprised of mounting side surfaces of said lead terminals, the rest of the second surface being exposed from said molding resin,
   wherein each front end face of said lead terminals is exposed from said molding resin, and is plated with a metal having better solderability than the material of said lead frame, and
   wherein said molding resin is also arranged between the respective lead terminals.

4. The semiconductor device according to claim 3, wherein said metal is either gold, silver, palladium, or an alloy thereof.

5. The semiconductor device according to 3,
   wherein each of the front end faces of said lead terminals is comprised of a cut face and a concave face connected to each other, and
   wherein said concave face is plated.

\* \* \* \* \*